United States Patent
Wang et al.

(10) Patent No.: US 8,426,271 B1
(45) Date of Patent: Apr. 23, 2013

(54) METHOD FOR MANUFACTURING A GATE-CONTROL DIODE SEMICONDUCTOR MEMORY DEVICE

(75) Inventors: Pengfei Wang, Shanghai (CN); Chengwei Cao, Shanghai (CN); Qingqing Sun, Shanghai (CN); Wei Zhang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/534,998

(22) Filed: Jun. 27, 2012

(30) Foreign Application Priority Data

Jan. 5, 2012 (CN) .......................... 2012 1 0001549

(51) Int. Cl.
*H01L 21/336* (2006.01)

(52) U.S. Cl.
USPC ............................. 438/257; 438/239; 438/261

(58) Field of Classification Search .................. 438/104, 438/257, 261, 263, 264, 238, 239, 240; 257/43
See application file for complete search history.

(56) References Cited

U.S. PATENT DOCUMENTS

| | | | |
|---|---|---|---|
| 2002/0057610 A1* | 5/2002 | Baliga ........................... | 365/200 |
| 2007/0272922 A1* | 11/2007 | Kim et al. ....................... | 257/43 |
| 2010/0050745 A1* | 3/2010 | Liu et al. ....................... | 73/31.06 |

* cited by examiner

*Primary Examiner* — Kevin M Picardat
(74) *Attorney, Agent, or Firm* — Jenkins, Wilson, Taylor & Hunt, P.A.

(57) ABSTRACT

This invention belongs to semiconductor device manufacturing field and discloses a method for manufacturing a gate-control diode semiconductor storage device. When the floating gate voltage is relatively high, the channel under the floating gate is of n type and the device is of a simple gate-control pn junction structure; by controlling effective n-type concentration of the ZnO film through back-gate control, inverting the n-type ZnO into p-type through the floating gate and using NiO as a p-type semiconductor, an n-p-n-p doping structure is formed. The quantity of charges in the floating gate determines the device threshold voltage, thus realizing the memory functions. This invention features capacity of manufacturing memory devices able to reduce the chip power consumption through advantages of high driving current and small sub threshold swing, is applicable to semiconductor memory devices manufacturing based on flexible substrates and flat panel displays and floating gate memories, etc.

7 Claims, 4 Drawing Sheets

METHOD FOR MANUFACTURING A GATE-CONTROL DIODE SEMICONDUCTOR MEMORY DEVICE

CROSS-REFERENCE TO RELATED APPLICATION

This application claims priority to Chinese Patent Application No. CN 201210001549.3 filed on Jan. 5, 2012, the entire content of which is incorporated by reference herein.

BACKGROUND OF THE INVENTION

1. Technical Field

The present invention belongs to the technical field of semiconductor memory device manufacturing, relates to a method for manufacturing a semiconductor memory device, and more especially, to a method for manufacturing a gate-control diode semiconductor memory device.

2. Description of Related Art

The structure of the mainstream floating-gate transistor at present is as shown in FIG. 1, including a drain 102 and a source 103 formed in a substrate 101 and polycrystalline silicon gates 105 and 107 formed on the substrate 101, wherein the electrically-connected polycrystalline silicon gate 107 is called a "control gate" and the floating polycrystalline silicon gate 105 is called a "floating gate". The floating gate 105 is isolated with the substrate 101 and the control gate 107 through insulation dielectric layers 104 and 106 respectively. The floating-gate technology is first applied to EPROM and EEPROM.

The floating gate transistor, of which the working principle is that the transistor threshold voltage is changed according to the fact of whether there are charges stored or how many charges are stored on the floating gate so as to change the external features of the transistor, has now become the basic device structure of on-volatile semiconductor memories. Currently, with the continuous development of integrated circuits, the size of MOSFET (metal-oxide-semiconductor field-effect transistor) is becoming smaller and smaller, and the transistor density on unit arrays is becoming higher and higher. The leakage current between the source and the drain of the MOSFET is increasing rapidly with the decrease of channel length. All these seriously affect the maintenance of the electrons on the floating gate. With the repeat of erasing and writing, the channel insulation film will be damaged, which may cause the leakage of the electrons in the floating gate. Moreover, the minimum sub-threshold swing (SS) of the traditional MOSFET is limited to 60 mv/dec, which restricts the opening and closing speed of the transistor.

BRIEF SUMMARY OF THE INVENTION

In view of this, the present invention aims at providing a method for manufacturing semiconductor memory devices capable of decreasing the leakage current and the SS value of floating-gate memory devices so as to improve the performances thereof.

The memory device provided in the present invention adopts the positive feedback automatic gain principle. Namely, when the doping type of a planar semiconductor device is p-n-p-n, two pairs of interdependent triodes, p-n-p and n-p-n, are generated. Usually, the two triodes can be magnified mutually, which may cause the increase of the device current and further cause the breakdown of the device in severe cases. To apply this characteristic into thin-film semiconductors, a gate-control diode semiconductor memory based on the ZnO semiconductor material is provided in the present invention. When the floating gate voltage is high and the channel under the floating gate is of n type, the device has a simple gate-control pn junction structure. By way of controlling the effective n type concentration of the ZnO film from the back gate, inverting the n-type ZnO to p-type through the floating gate and using NiO as a p-type semiconductor, an n-p-n-p doping structure is formed. The quantity of charges in the floating gate determines the device threshold voltage, thus realizing the memory functions.

A method for manufacturing the gate-control diode semiconductor memory device above is provided in the present invention, including the following steps:
provide a heavily-doped n-type silicon substrate;
form a first kind of insulation film on the n-type silicon substrate;
form a ZnO layer on the first kind of insulation film;
etch the ZnO layer to form an active region;
form a second kind of insulation film on the ZnO dielectric layer;
etch the second kind of insulation film to form a window located at one end of the ZnO active region;
coat the second kind of insulation film through spin coating with a layer of spin-coating dielectric of the first doping type which makes contact with the ZnO at the window of the second kind of insulation film;
form a doping region (namely a source region) of the first doping type at the window of the second kind of insulation film in the ZnO dielectric layer through the high-temperature diffusion process, wherein the other parts of the ZnO are not doped due to the barrier of the second kind of insulation film;
remove the residual spin-coating dielectric of the first doping type;
define a pattern through photoetching and etch the second kind of insulation film to define the position of a drain region and a channel region, wherein the drain region is on the opposite side to the source region on the ZnO and the channel region is between the source region and the drain region;
form a third kind of insulation film through deposition;
deposit a first layer of conductive material as the floating gate conductive material and define the pattern of the floating gate region thereof though photoetching and etching, wherein the floating gate region located between the source region on the ZnO active region and the drain region at the edge of the other end of the ZnO, is of square pattern, indirectly adjacent to the source region with a spacing of 10 nm-100 μm, and is 10 nm-100 μm away from the edge of the ZnO;
cover the exposed parts of the floating gate and the active region to form a fourth kind of insulation film;
etch out the fourth kind of insulation film on the source region and the drain region to define the positions of the contact holes of the drain and the source;
form a second kind of conductive film through deposition and etch the second kind of conductive film to form a drain electrode, a gate electrode and a source electrode which are independent of one another, wherein the source electrode makes contact with the source region on one side of the floating gate region through the source contact hole, the drain electrode makes contact with the ZnO drain region on the other side of the floating gate region through the drain contact hole and the gate electrode cover the non-etched fourth kind of insulation film on the floating gate region.

Further, the method for manufacturing a gate-control diode semiconductor memory device, characterized in that the first kind of insulation film is of silicon oxide and with a thickness of 1-500 nm.

Furthermore, the method for manufacturing a gate-control diode semiconductor memory device, characterized in that, the second kind of insulation film is of silicon oxide or silicon nitride, the third and fourth kinds of insulation film are of high dieletric constant materials such as $SiO_2$, $Si_3N_4$ or $HfO_2$, the thickness of the ZnO dielectric layer is 1-100 nm, the first and second kinds of conductive film are of heavily-doped polycrystalline silicon, copper, tungsten, aluminum, titanium nitride or tantalum nitride, and the first doping type is p-type doping.

The method for manufacturing a gate-control diode semiconductor memory device features a simple process, low manufacturing cost, and capacity of manufacturing memory devices with advantages such as high driving current and small sub-threshold swing, and is especially applicable to the manufacturing of memory devices based on flexible substrate and devices such as flat panel display and floating gate memory.

DETAILED DESCRIPTION OF THE INVENTION

Figure 1:
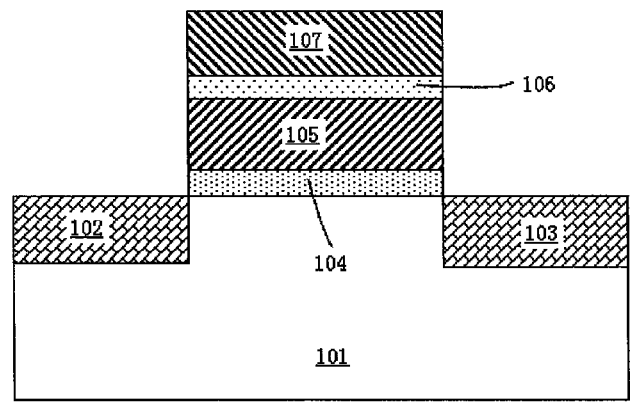
FIG. 1 is the schematic diagram of the structure of the existing floating gate transistor.

An exemplary embodiment of the present invention is further detailed herein by referring to the drawings. In the drawings, the thicknesses of the layers and regions are either zoomed in or out for the convenience of description, so they shall not be considered as the true size. Although these drawings cannot accurately reflect the true size of the device, they still reflect the relative positions among the regions and composition structures completely, especially the up-down and adjacent relations.

The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention. Meanwhile, the term "substrate" used in the following description can be considered as a semiconductor substrate during manufacturing process, and other film layers prepared on it may also be included.

Firstly, develop a silicon oxide film with a thickness of 20 nm on a provided silicon substrate 201 heavily doped with n-type impurity ions, then deposit a ZnO film 203 with a thickness of 10 nm on the silicon oxide film 202 through atomic layer deposition and form a silicon dioxide film 204 on the ZnO film 203 through spin coating.

Figure 2:
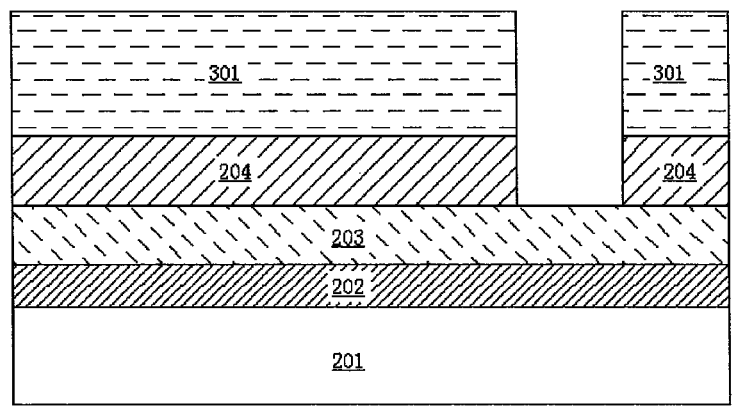
FIGS. 2-9 are the process flow diagrams of an embodiment of the method for manufacturing a gate-control diode semiconductor memory device disclosed in the present invention.

Deposit a layer of photoresist 301 and form a pattern through masking film, exposal and development, and etch the silicon dioxide film 204 to form a window, as shown in FIG. 2.

Figure 3:
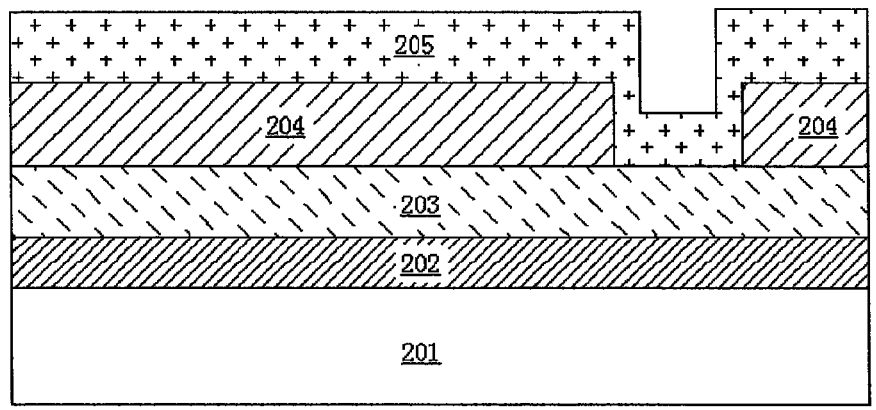
Figure 4:
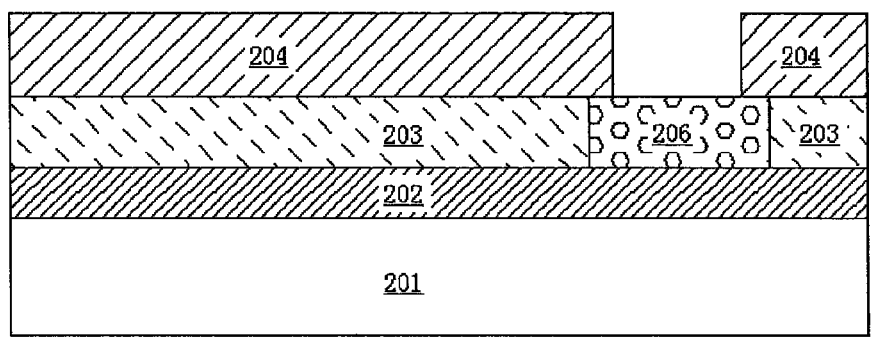

Next, remove the photoresist 301 and coat a layer of spin-coating dielectric 205 doped with p-type impurity ions (in the embodiment of the present invention, SOD-P507 is used) through spin coating, as shown in FIG. 3. Then form a p-type doping region 206 in the ZnO film 203 through the diffusion process and the construction after removing the spin-coating dielectric 205 is as shown in FIG. 4.

Figure 5:
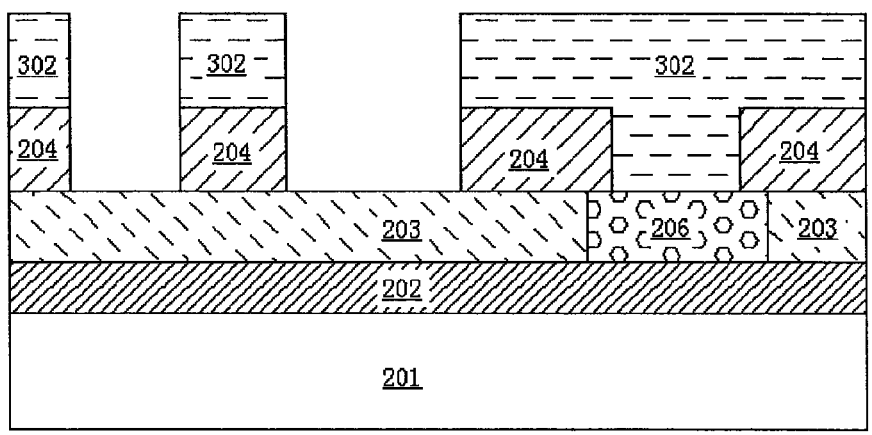

Deposit a new layer of photoresist 302 and form a pattern through masking film, exposal and development, and etch the silicon dioxide film 204 to define the positions of the drain and the gate, as shown in FIG. 5.

Figure 6:
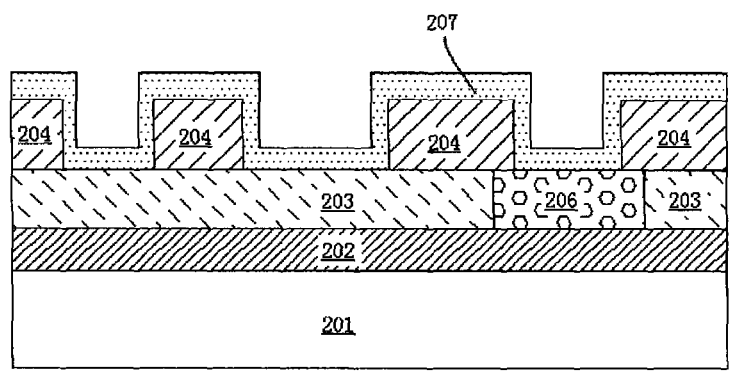

After removing the photoresist 302, deposit a layer of high dielectric constant material 207 such as $HfO_2$, as shown in FIG. 6.

Figure 7:
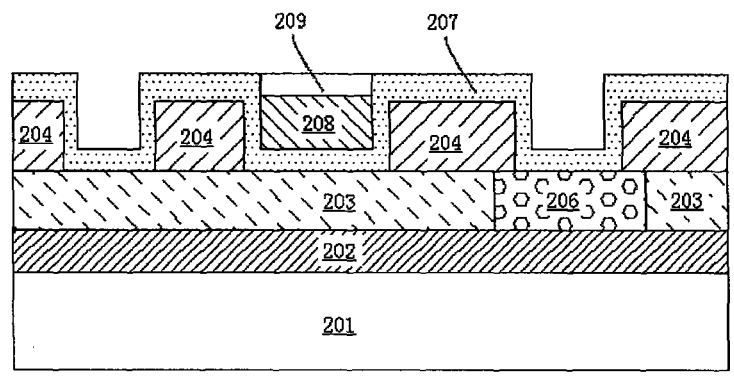

Next, deposit a polycrystalline silicon film, etch it to form a device floating gate 208 and form an insulation dielectric layer 209 such as silicon oxide on the floating gate 208, as shown in FIG. 7.

Figure 8:
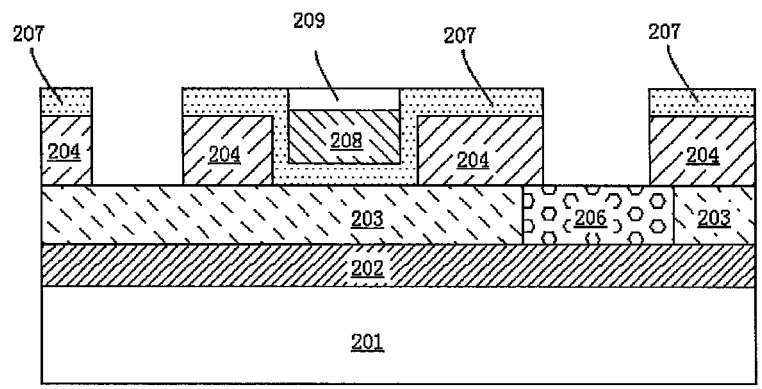

Next, deposit a layer of photoresist again and form a pattern through photoetching and then etch the high dielectric constant material 207 to define the positions of the drain and the source, the construction after removing the photoresist is as shown in FIG. 8.

Figure 9:
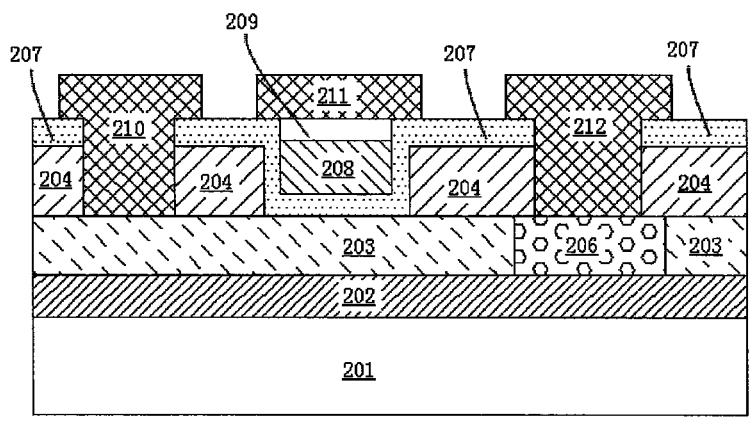

Finally, deposit a metal conductive film such as aluminum and then form a drain electrode 210, a gate electrode 211 and a source electrode 212 of the device through photoetching and etching, as shown in FIG. 9.

In the device structure as shown in FIG. 9, since ZnO has the characteristics of an n-type semiconductor, when the source and drain are applied with a forward bias, the device structure is equivalent to a forward-biased $P^+N$ junction structure and the device is conductive if the gate is applied with positive voltage. If the gate is applied with a negative voltage, a p-type region 400 is formed in the ZnO dielectric layer 203 under the gate electrode 208, the device is equivalent to a p-n-p-n junction structure and is cut off.

As described above, without deviating from the spirit and scope of the present invention, there may be many significantly different embodiments. It shall be understood that the present invention is not limited to the specific embodiments described in the Specification except those limited by the Claims herein.

What is claimed is:
1. A method for manufacturing a gate-control diode semiconductor memory device, characterized in that, including the following steps:
   provide a heavily-doped n-type silicon substrate;
   form a first kind of insulation film on the n-type silicon substrate;
   form a ZnO layer on the first kind of insulation film;
   etch the ZnO layer to form an active region;
   form a second kind of insulation film on the ZnO dielectric layer;
   etch the second kind of insulation film to form a window located at one end of the ZnO active region;
   coat the second kind of insulation film through spin coating with a layer of spin-coating dielectric of the first doping type which makes contact with the ZnO at the window of the second kind of insulation film;
   form a doping region (namely a source region) of the first doping type at the window of the second kind of insulation film in the ZnO dielectric layer through the high-temperature diffusion process, wherein the other parts of the ZnO are not doped due to the barrier of the second kind of insulation film;
   remove the residual spin-coating dielectric of the first doping type;
   define a pattern through photoetching and etch the second kind of insulation film to define the position of a drain region and a channel region, wherein the drain region is on the opposite side of the source region on the ZnO and the channel region is between the source region and the drain region;

form a third kind of insulation film through deposition;

deposit a first layer of conductive material as the floating gate conductive material and define the pattern of the floating gate region thereof though photoetching and etching, wherein the floating gate region located between the source region on the ZnO active region and the drain region at the edge of the other end of the ZnO, is of square pattern, indirectly adjacent to the source region with a spacing of 10 nm-100 μm, and is 10 nm-100 μm away from the edge of the ZnO;

cover the exposed parts of the floating gate and the active region to form a fourth kind of insulation film;

etch out the fourth kind of insulation film on the source region and the drain region to define the positions of the contact holes of the drain and the source;

form a second kind of conductive film through deposition and etch the second kind of conductive film to form a drain electrode, a gate electrode and a source electrode which are independent of one another, wherein the source electrode makes contact with the source region on one side of the floating gate region through the source contact hole, the drain electrode makes contact with the ZnO drain region on the other side of the floating gate region through the drain contact hole and the gate electrode cover the non-etched fourth kind of insulation film on the floating gate region.

2. The method for manufacturing a gate-control diode semiconductor memory device according to claim 1, characterized in that the first kind of insulation film is of silicon oxide and with a thickness of 1-500 nm.

3. The method for manufacturing a gate-control diode semiconductor memory device according to claim 1, characterized in that the second kind of insulation film is of silicon oxide or silicon nitride.

4. The method for manufacturing a gate-control diode semiconductor memory device according to claim 1, characterized in that the third and fourth kinds of insulation film are of $SiO_2$, $Si_3N_4$ or high dieletric constant material $HfO_2$.

5. The method for manufacturing a gate-control diode semiconductor memory device according to claim 1, characterized in that the thickness of the ZnO dielectric layer is 1-100 nm.

6. The method for manufacturing a gate-control diode semiconductor memory device according to claim 1, characterized in that the first and second kinds of conductive film are of heavily-doped polycrystalline silicon, copper, tungsten, aluminum, titanium nitride or tantalum nitride.

7. The method for manufacturing a gate-control diode semiconductor memory device according to claim 1, characterized in that the first doping type is silicon p-type doping.

* * * * *